(12) United States Patent
Doehler et al.

(10) Patent No.: US 6,878,207 B2
(45) Date of Patent: Apr. 12, 2005

(54) GAS GATE FOR ISOLATING REGIONS OF DIFFERING GASEOUS PRESSURE

(75) Inventors: Joachim Doehler, Santa Barbara, CA (US); Vincent Cannella, Beverly Hills, MI (US)

(73) Assignee: Energy Conversion Devices, Inc., Rochester Hills, MI (US)

( * ) Notice: Subject to any disclaimer, the term of this patent is extended or adjusted under 35 U.S.C. 154(b) by 45 days.

(21) Appl. No.: 10/368,835

(22) Filed: Feb. 19, 2003

(65) Prior Publication Data

US 2004/0159285 A1 Aug. 19, 2004

(51) Int. Cl.[7] .................. C23C 16/00; C23C 14/00; C23F 1/00
(52) U.S. Cl. ............. 118/718; 156/345.31; 204/298.24; 118/719; 118/733
(58) Field of Search ................... 118/718, 733; 204/298.24; 414/217

(56) References Cited

U.S. PATENT DOCUMENTS

| | | | | |
|---|---|---|---|---|
| 2,952,569 A | * | 9/1960 | Baer et al. ................ 427/295 |
| 2,972,330 A | * | 2/1961 | Bugbee ..................... 118/718 |
| 2,989,026 A | * | 6/1961 | Gardner et al. ............ 118/718 |
| 3,660,146 A | * | 5/1972 | Chadsey et al. ........... 427/172 |
| 3,868,106 A | * | 2/1975 | Donckel et al. ........... 277/345 |
| 4,551,310 A | * | 11/1985 | Imada et al. ........... 422/186.05 |
| 5,088,908 A | * | 2/1992 | Ezaki et al. .................. 425/73 |
| 6,334,751 B1 | * | 1/2002 | Vanden Brande et al. .. 414/217 |
| 2003/0079837 A1 | * | 5/2003 | Hirai et al. ............ 156/345.31 |

* cited by examiner

*Primary Examiner*—Parviz Hassanzadeh
*Assistant Examiner*—Karla Moore
(74) *Attorney, Agent, or Firm*—Anthony J. Serventi; Martin S. Siskind; David W. Schumaker

(57) ABSTRACT

Disclosed herein is an improved gas gate for interconnecting regions of differing gaseous composition and/or pressure, more particularly between atmosphere and a vacuum. The gas gate includes a cylinder within a housing situated between the regions of differing gaseous pressure, wherein the gas gate provides for choke mode transonic flow of air leaks between the regions. A web of substrate material is adapted to move between the regions with at least one roller in a first region and at least one roller in a second region. The rollers are positioned to create sufficient tension as the web advances over the top peripheral portion of the cylinder between the two regions or under the bottom peripheral portion of the cylinder between the two regions.

60 Claims, 4 Drawing Sheets

US 6,878,207 B2

GAS GATE FOR ISOLATING REGIONS OF DIFFERING GASEOUS PRESSURE

FIELD OF THE INVENTION

This invention relates generally to isolating mechanisms for operatively interconnecting regions of differing gaseous pressure. More specifically the instant invention relates to a gas gate that separates a first region having an atmospheric pressure from an evacuable second region having a pressure from about 0.01 Torr and below. Further, the gas gate of the present invention uses a cylinder to simultaneously achieve atmospheric-to-vacuum or vacuum-to-atmospheric capability and non-contact on the film deposition side of a moving web of material.

BACKGROUND OF THE INVENTION

A variety of products may be fabricated by thin film processes. Examples of the products that may be fabricated by the deposition of thin film materials include interferometer stacks for optical control and solar control, semiconductor based solar cells, aluminized coffee pouches and organic semiconductor devices such as OLED displays, organic FETs, smart tags, organic PV devices and sensors, organic semiconductors, etc. These products may be mass produced using roll-to-roll processes. Some roll-to-roll processors use a pay-off roll and a take-up roll kept in vacuum chambers. Once the pay-off roll is empty, or the take-up roll is full, the respective roll must be changed to a fresh roll. During the changing process, the pay-off and take-up chambers must be vented, opened, loaded/unloaded, closed and pumped out. During this cycle, the production process is typically interrupted. Alternatively, the roll to roll production of some types of devices requires the integration of many processes in-line without intermediate roll-up and unrolling of the product substrates, because any contact with the product surface during rolling completion would destroy the device performance. In such cases it is critical for a product substrate to be able to pass continuously from processes at atmospheric pressure to processes in vacuum, and back to atmospheric pressure.

Typically, gas gates are incorporated between discreet regions for deposition to maintain the chemical integrity of the regions. As disclosed in U.S. Pat. No. 4,462,332 to Nath et al., assigned to the assignee of the instant application and the disclosure of which is hereby incorporated herein by reference, it has been determined that despite the relatively small size of the gas gate passageway, dopant process gases introduced into one deposition chamber back diffuse into the adjacent chamber, thereby contaminating the process gases introduced thereinto and the semiconductor layer deposited in the adjacent chamber. The '332 patent discloses an apparatus (namely ceramic magnets positioned above the gas gate passageway for urging the magnetic substrate upwardly) by which the height dimension of the passageway could be reduced. The reduction in the height dimension of the passageway provided for a corresponding reduction of the back diffusion of dopant gases for a given flow rate, thereby decreasing the contamination of the process gases introduced into the intrinsic deposition chamber.

However, because the magnets urge the substrate into sliding contact with the upper passageway wall, frictional abrasion between the wall and the bare side of the substrate causes problems with the deposition apparatus such as, for example, wear of the upper passageway wall of the gas gate. Also, abraded particles of substrate and passageway wall material collect in the passageway and deposition chambers causing scratching of the layered side of the substrate and co-depositing with the semiconductor material, which in turn, causes short circuiting due to the protruding particles which cannot be fully covered by a one micron thick semiconductor alloy layer. The abrasion, in addition to being detrimental to the semiconductor layer and the equipment, limits the minimum thickness of the web of substrate material which can be realistically used due to possible tearing. In some product applications the substrate the substrate material is non magnetic, for example, a polymer substrate.

Additionally, as was disclosed in U.S. Pat. Nos. 4,438,724 and 4,450,786 each to Doehler et al., both assigned to the assignee of the instant application and the disclosures of which are hereby incorporated herein by reference, when the web of substrate material is urged against the upper wall of the passageway, the passageway is divided by the web of substrate into a relatively narrow upper portion, between the substrate and the upper passageway wall, and a relatively wide lower portion, between the substrate and the lower passageway wall. Also, irregular spacing between the substrate and the upper passageway wall occurred because waffling (warping) of the web of substrate material could not be entirely eliminated by the attractive force of the magnets. Much of the warping of the substrate is caused by temperature gradients in the substrate. The process gases, being inherently viscous (and especially viscous at the elevated deposition temperatures employed with glow discharge deposition processes), are unable to travel through the narrow upper portion with sufficient velocity to prevent cross-contamination of process gases from one deposition chamber to the other. It was to the end of decreasing the amount of cross-contamination of process gases through the narrow upper portion between the bare side of the substrate and the upper passage wall that the '724 and '786 patents were directed.

In the past, considerable efforts have been made to develop processes for depositing layers of amorphous semiconductor alloy material, each of which can encompass relatively large areas, and which can be doped to form p-type and n-type materials for the fabrication of p-i-n-type photovoltaic devices which are, in operation, substantially equivalent to their crystalline counterparts. For many years such work with amorphous silicon or germanium films was substantially unproductive because of the presence therein of microvoids and dangling bonds which produce a high density of localized states in the energy gap. Initially, the reduction of the localized states was accomplished by glow discharge deposition of amorphous silicon films using silane ($SiH_4$) gas and hydrogen gas as precursors. The material so deposited is an intrinsic amorphous material consisting of silicon and hydrogen. To produce a doped amorphous material, phosphine gas ($PH_3$) for n-type or a Boron-containing gas, such as diborane ($B_2H_6$) for p-type conduction, is premixed with the silane gas. The material so deposited includes supposedly substitutional phosphorus or boron dopants and is shown to be extrinsic and of n or p conduction type, respectively.

It is now possible to prepare greatly improved amorphous silicon alloy materials, that have significantly reduced concentrations of localized states in the energy gap thereof, while providing high quality electronic properties by glow discharge as is fully described in U.S. Pat. No. 4,226,898 to Ovshinsky et al., and by vapor deposition as described in U.S. Pat. No. 4,217,374 to Ovshinsky et al., both assigned to the assignee of the instant application and the disclosures of which are hereby incorporated by reference. As disclosed in these patents, fluorine introduced into the amorphous silicon semiconductor operates to substantially reduce the density of localized states therein and facilitates the addition of other alloying materials, such as germanium. Activated fluorine readily diffuses into, and bonds to, amorphous silicon in a matrix body to substantially decrease the density of localized states therein. This is because the small size of the fluorine atoms enable them to be readily introduced into an amorphous silicon matrix. The fluorine is believed to bond to the dangling bonds of the silicon and form a partially ionic stable bond with flexible bonding angles, which results in a more stable and more efficient compensation or alteration than could be formed by hydrogen, or other compensating or altering agents which were previously employed.

The concept of utilizing multiple cells, to enhance photovoltaic device efficiency, was discussed at least as early as 1955 by E. D. Jackson, U.S. Pat. No. 2,949,498. The multiple cell structures therein discussed utilized p-n junction crystalline semiconductor devices. Essentially the concept is directed to utilizing different band gap devices to more efficiently collect various portions of the solar spectrum and to increase open circuit voltage ($V_{oc}$). The tandem cell device has two or more cells with the light directed serially through each cell, with a large band gap material followed by a smaller band gap material to absorb the light passed through the first cell or layer. By substantially matching the generated currents from each cell, the overall open circuit voltage is the sum of the open circuit voltages of each cell while the short circuit current remains substantially constant.

Due to the beneficial properties attained by the introduction of fluorine, amorphous alloys used to produce cascade type multiple cells may now incorporate fluorine to reduce the density of localized states without impairing the electronic properties of the material. Further band gap adjusting element(s), such as germanium and carbon, can be activated and are added in vapor deposition, sputtering or glow discharge processes. The band gap is adjusted as required for specific device applications by introducing the necessary amounts of one or more of the adjusting elements into the deposited alloy cells in at least the photocurrent generation region thereof. Since the band gap adjusting element(s) has been tailored into the cells without adding substantial deleterious states, the cell material maintains high electronic qualities and photoconductivity when the adjusting element (s) are added to tailor the device wavelength characteristics for a specific photoresponse application.

It is of obvious commercial importance to be able to mass produce photovoltaic devices. Unlike crystalline silicon which is limited to batch processing for the manufacture of solar cells, amorphous silicon semiconductor alloys can be deposited in multiple layers over large area substrates to form solar cells in a high volume, continuous processing system. Continuous processing systems of this kind are disclosed, for example, in U.S. Pat. Nos. 4,440,409; 4,542, 711; 4,410,558; 4,438,723; and 4,492,181 each of which is assigned to the assignee of the instant application and the disclosures of which are hereby incorporated by reference. As disclosed in these patents, a substrate may be continuously advanced through a succession of deposition chambers, wherein each chamber is dedicated to the deposition of a specific semiconductor layer. In making a solar cell of p-i-n-type configuration, the first chamber is dedicated for depositing a p-type amorphous silicon semiconductor alloy material, the second chamber is dedicated for depositing an intrinsic amorphous silicon semiconductor alloy material, and the third chamber is dedicated for depositing an n-type amorphous silicon semiconductor alloy material. Since each deposited semiconductor alloy material, and especially the intrinsic semiconductor alloy material must be of high purity, the deposition environment in the deposition chamber is isolated from the doping constituents within the other chambers to prevent cross-contamination of doping constituents into the intrinsic process gases in the intrinsic chamber. In the previously mentioned patents, wherein the systems are primarily concerned with the production of photovoltaic cells, chemical isolation between the chambers is accomplished by gas gates through which (1) a unidirectional flow of process gases between deposition chambers is established, and (2) an inert gas may be "swept" along the web of substrate material. The gas gate disclosed in previously mentioned U.S. Pat. No. 4,462,332 contemplated the creation of a plurality of magnetic fields adapted to urge the magnetic web of substrate material against a wall of the gas gate passageway opening so that the height dimension of the passageway opening could be reduced. The reduced height of the opening, in the described pressure and flow regimes, correspondingly decreased the quantity of process gas, which would otherwise diffuse from the dopant deposition chambers to the intrinsic deposition chamber, without correspondingly increasing the risk that the amorphous semiconductor layers deposited on the substrate would contact and be damaged by a wall of the gas gate passageway opening.

While the magnetic gas gate disclosed in U.S. Pat. No. 4,462,332 reduced the height dimension of the passageway opening, this gas gate design caused two additional problems, (1) the aforementioned problems of friction, and (2) it divided the passageway into wide and narrow portions, as discussed hereinabove. Regarding the latter of these problems, the velocity of the inert sweep gas and residual process gases traveling through the wide lower portion is sufficiently great to substantially prevent cross-contamination of dopant gases into the intrinsic chamber. However, due to the viscosity of the process gases, the drag on the sweep gases along (1) the upper passageway wall and (2) the uncoated surface of the substrate (which define the relatively narrow upper portion of the passageway) results in a relatively low velocity flow therethrough. Accordingly, an undesirably high amount of dopant process gas is able to diffuse into the intrinsic chamber through the narrow upper portion.

The problem of cross-contamination was reduced in U.S. Pat. Nos. 4,438,724 and 4,450,786 by providing a plurality of elongated grooves (extending the entire length of the gas gate passageway opening) from the dopant deposition chamber to the adjacent intrinsic deposition chamber in the wall of the passageway opening above the web of substrate material. In this manner, a plurality of spaced, relatively high velocity flow channels were provided in the space between the uncoated surface of the web of substrate material and the upper wall of the passageway opening. Because the sweep gases were forced into the channels by independent means, they flowed unidirectionally therethrough at substantial velocities despite the drag incurred as said gases contacted the passageway wall and the substrate surface. While the gas gate of the '724 and '786 patents reduced the problem of cross-contamination through the aforementioned narrow upper section, it failed to reduce the problem of frictional abrasion between the uncoated side of the substrate and the upper passageway wall.

The magnetic roller gas gate of commonly owned and assigned our U.S. Pat. No. 5,374,313 and hereby incorporated herein by reference, substantially reduced the frictional abrasion between the unlayered side of the substrate and the passageway wall without substantially increasing in the cross-contamination of process gases between deposition chambers. While the magnetic roller gas gate of the '313 Patent reduced the frictional abrasion problem and did not increase the cross contamination problem, the gas gates of the prior art cannot be used to operatively interconnect regions having a pressure differential between the chambers of greater than about 10%. However in many instances, it is desirable, if not essential, to interconnect two processing chambers having pressure differentials of greater than an order of magnitude (i.e., such as pressures of $10^{-1}$ and $10^{-3}$ Torr respectively).

Although the foregoing discussion dealt with a single dopant deposition chamber and an adjacent transition chamber, it should be apparent that other deposition chambers may be operatively connected to the air-to-vacuum gas gate of the present invention for any apparatus or process that uses roll to roll deposition. For example, a p-type deposition chamber may be connected on one side of the intrinsic deposition chamber and an n-type deposition chamber may be connected to the other side of the intrinsic deposition chamber so as to produce a p-i-n type semiconductor device. Alternatively, a plurality of these triads of deposition chambers could be interconnected to produce a plurality or p-i-n-type cells. For that matter, the improved gas gate of the instant invention is applicable to any continuous production apparatus or process that requires the chemical isolation of regions having different gaseous pressure.

SUMMARY OF THE INVENTION

The present invention relates to a gate that allows a web of substrate to be introduced continuously from a first region having a pressure into a second region having a pressure different from the first region. More particularly, the present invention relates to an air-to-vacuum gas gate that allows a web to be introduced continuously into a vacuum chamber from an atmospheric region or into an atmospheric region from a vacuum chamber. Additionally, the present invention discloses an apparatus for continuously fabricating devices on a web of substrate material by depositing thereon at least one layer in at least one vacuumized deposition chamber, wherein the web may be introduced continuously into the deposition chamber(s) from the atmosphere via a first transition chamber then exit the deposition chamber(s) into the atmosphere via a second transition chamber. The gas gate of the present invention may be used with any web material, including but not limited to thermoplastic polymer, such as polycarbonate, poly methyl methacrylate, polyolefin, polyester, poly vinyl chloride, polysulfone, cellulosic substances, etc. The composition of each layer is dependent upon the particular gases introduced into and isolated from each of the deposition chambers.

In a preferred embodiment, the web is fed from the atmosphere into a pressurized transition chamber having a gas gate of the present invention between the atmosphere and the transition chamber that leads to one or more deposition chambers then from the deposition chambers into a second pressurized transition chamber having a gas gate of the present invention and back into the atmosphere. More particularly, the transition chamber and ambient air are separated by a gas gate which includes a relatively narrow passageway created by a cylinder (1) through which the web of substrate material passes; and (2) adapted to substantially isolate the ambient air from the transition chamber to permit the exchange of a web without upsetting the pressure of the deposition chambers.

The gas gate of the present invention includes a cylinder within a housing situated between the regions of differing gaseous pressure. A web of substrate material is adapted to move between the regions over the cylinder through a small gap between the top peripheral surface of the cylinder and the housing. The gap is sufficiently wide to allow the web of substrate to maintain contact with the cylinder without coming in contact with the housing. Rollers are positioned in the atmospheric region and the transition chamber to guide the web of substrate material into and out of the top peripheral gap. In a preferred embodiment, two sets of rollers guide the web into the gap and two sets of rollers guide the web out of the gap, which minimizes the contact between the rollers and the web. The sets of rollers are positioned to create an angle of entry into and an angle of exit out of the cylinder, because the web assumes the arced shape of the top peripheral portion of the cylinder. Further, the angles are necessary to prevent contact by the web with the housing, contact that may contaminate or damage the substrate. In another embodiment, rollers are positioned so that the bottom peripheral surface of each roller is below the top peripheral surface of the cylinder, which creates tension as the web advances below the first roller, over the cylinder and below the second roller.

In another embodiment, the position of the web relative to the cylinder is reversed from the top peripheral portion of the cylinder to the bottom peripheral portion of the cylinder. In this embodiment, a web of substrate material is adapted to move between the regions under the cylinder through a small gap between the bottom peripheral surface of the cylinder and the housing. The bottom peripheral gap is sufficiently wide to allow the web of substrate to maintain contact with the cylinder without coming in contact with the housing. Rollers are positioned in the first region and the second region to guide the web of substrate material into and out of the bottom peripheral gap. In a preferred embodiment, two sets of rollers guide the web into the gap and two sets of rollers guide the web out of the gap, which minimizes the contact between the rollers and the web. The sets of rollers are positioned to create an angle of entry into and an angle of exit out of the cylinder, because the web assumes the arced shape of the bottom peripheral portion of the cylinder. Further, the angles are necessary to prevent contact by the web with the housing, contact that may contaminate or damage the substrate. In another embodiment, rollers are positioned so that the top peripheral surface of each roller is below the bottom peripheral surface of the cylinder, which creates tension as the web advances over the first roller, under the cylinder and over the second roller.

Preferably, the first region and the second region have differing gaseous pressure and at least one of the first and second chambers is evacuable. In a preferred embodiment, a gas gate of the present invention may take a web of substrate from an atmospheric region having an atmospheric pressure to a transition chamber having a pressure lower than the atmospheric pressure. Additionally, a gas gate of the present invention may take a web of substrate from a transition chamber having a pressure lower than atmospheric pressure to an atmospheric region having an atmospheric pressure.

The housing has a top plate and a bottom plate and the cylinder is set between the top plate and the bottom plate. Preferably, the top plate has a contour fashioned to approximately equal the arc of the top peripheral portion of the cylinder. Similarly, the bottom plate preferably has a contour fashioned to approximately equal the arc of the bottom peripheral portion of the cylinder. Further, the housing has a first side wall between the top plate and the bottom plate and a second side wall between the top plate and the bottom plate. The cylinder is positioned between the first side wall and the second side wall to rotate about an axis between the side walls. A first O-ring may be set between the first side wall and the cylinder. The first O-ring adapted to reduce the influx of air from the space between the first side wall and the cylinder. A second O-ring may be set between the second side wall and the cylinder. The second O-ring adapted to reduce the influx of air from the space between the second side wall and the cylinder. Preferably, the O-ring are C-shaped O-rings adapted to receive pressure to press the respective O-ring against the cylinder. The pressure may be supplied by at least one first spring set between the first side wall and the first O-ring, and at least one second spring set between the second side wall and the second O-ring.

The gas gate is characterized in that the height of the passageway between the top plate of the housing and the top peripheral portion of the cylinder or the passageway between the bottom plate of the housing and the bottom peripheral portion of the cylinder, depending on the embodiment. The flow rate of the gas therethrough provides for transonic flow of the gas between the cylinder inlet and at least one of the two interconnected regions, thereby effectively isolating one region, characterized by one composition and pressure, from another region, having a differing composition and/or pressure, by decreasing the mean-free-path length between collisions of diffusing species within the transonic flow region.

An embodiment of the present invention is to provide a gas gate that separates two regions of different gaseous pressure.

Another embodiment of the present invention is to provide an air-to-vacuum gas gate which separates an atmospheric region from a evacuable transition chamber that leads to a deposition chamber, which allows a web roll to be changed without venting the deposition chamber.

Another embodiment of the present invention is to provide roll to roll apparatus for continuously fabricating devices on a web of substrate material with a transition chamber that enables a pay-off roll or a take-up roll to be changed without disrupting the vacuum of the deposition chamber.

When the gas gate of the instant invention is used in an apparatus for the production of amorphous semiconductor solar cell devices, a transition chamber is set after the pay-off roll and before the take-up roll. Deposition chambers adapted to deposit amorphous silicon semiconductor alloys are set between the transition chambers. For example, a web of substrate may pass from an atmospheric region through a gas gate of the present invention into a first transition chamber and proceed into a first deposition chamber in which a first layer may be deposited onto one surface of the substrate in the first deposition chamber, the substrate can then pass through a second deposition chamber wherein a second layer is deposited atop the first layer, the substrate can then pass through a second transition chamber, then proceed through a gas gate of the present invention and into the atmospheric region.

DETAILED DESCRIPTION OF THE INVENTION

The current invention relates to an apparatus that allows a moving web of substrate to be introduced continuously into a vacuum chamber from an atmospheric region. A similar device at the other end of the production machine allows the web to be returned to atmospheric pressure from a vacuum chamber. The gas gate of the present invention is described as the invention relates to the production of a tandem or cascade-type photovoltaic cells, however, this is for illustrative purposes only and should not be considered limiting. It is understood that the embodiments of the gas gate described herein may be effectively incorporated into any system that requires a web of material to be advanced through regions of varying gaseous pressure. Additionally, the gas gate of the present invention allows various layers of deposition materials to be deposited onto the web of substrate without having the deposition areas of the web touch any solid object as the web enters and exits the deposition chambers.

I. The Photovoltaic Cell

Figure 1:
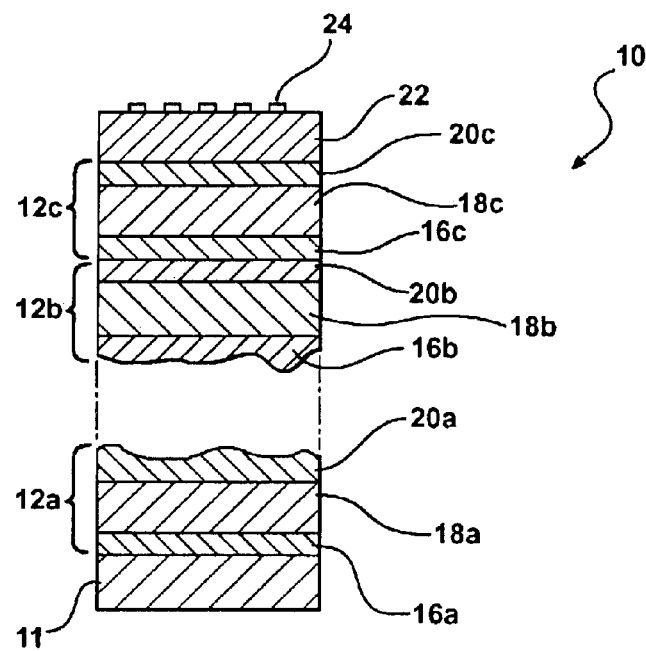
FIG. 1 is a fragmentary, cross-sectional view of a tandem or cascade photovoltaic device comprising a plurality of p-i-n-type cells, each layer of the cells formed from an amorphous silicon alloy material.

Referring to the drawings and particularly to FIG. 1, a tandem or cascade-type photovoltaic cell, formed of successive p-i-n layers each including an amorphous silicon alloy material, is shown generally by numeral 10. It is for the production of this type of photovoltaic device, wherein layers of amorphous silicon alloy material are continuously deposited onto a moving web of substrate material in isolated deposition chambers, that the gas gates of the present invention were developed.

FIG. 1 shows a p-i-n type photovoltaic device such as a solar cell made up of individual p-i-n type cells 12a, 12b and 12c. Below the lowermost cell 12a is a substrate 11 which may be transparent or formed from a metallic surfaced foil. Although certain applications may require a thin oxide layer and/or a series of base contacts prior to application of the amorphous semiconductor material, for purposes of this application, the term "substrate" shall include not only a flexible film, but also any elements added thereto by preliminary processing. The substrate material 11 may be stainless steel, aluminum, tantalum, molybdenum or chrome, as well as substrates formed of synthetic polymers, glass or glass-like material on which an electrically conductive electrode is applied.

Each of the cells 12a, 12b and 12c include an amorphous semiconductor body containing at least a silicon alloy. Each of the semiconductor bodies include an n-type conductivity region or layer 20a, 20b and 20c; an intrinsic region or layer 18a, 18b and 18c; and a p-type conductivity region or layer 16a, 16b and 16c. The term "amorphous" as used herein includes all materials exhibiting long-range disorder, regardless of their short or intermediate range order and regardless of whether those materials are otherwise labeled polycrystalline or crystalline. As illustrated, cell 12b is an intermediate cell and, as indicated in FIG. 1, additional intermediate cells may be stacked atop the illustrated cells without departing from the spirit or scope of the present invention. Also, although tandem p-i-n cells are illustrated, the gas gates of this invention are equally adapted for use in any multiple chamber apparatus. The novel air-to-vacuum gas gate described herein is illustrated as the invention is incorporated into a deposition for producing p-i-n cells. However, it should be readily apparent that the novel gas gate of the current invention is also applicable to any system requiring the isolation of regions of different gaseous pressure, such as deposition systems for producing n-i-p cells, chemical vapor deposition systems, or other organic semiconductors or organic light emitting diode (OLED) materials.

For each of the cells 12a, 12b and 12c, the p-type and n-type layers of semiconductor material are characteristically light transmissive and highly conductive. The intrinsic layers of semiconductor material are characterized by an adjusted wavelength threshold for solar photoresponse, high light absorption, low dark conductivity and high photoconductivity, including sufficient amounts of a band gap adjusting element or elements to optimize the band gap for the particular cell application. Preferably, the intrinsic layers of semiconductor material are band gap adjusted to provide cell 12a with the lowest band gap, cell 12c with the highest band gap and cell 12b with a band gap between the other two, as light enters the semiconductor material from the top. However, the intrinsic layers of semiconductor material are band gap adjusted to provide cell 12a with the highest band gap, cell 12c with the lowest band gap and cell 12b with a band gap between the other two, if light enters the semiconductor material from the bottom. The n-type layers of semiconductor material are characterized by low light absorption and high conductivity. The thickness of the band gap adjusted layers of intrinsic material may be in the range of 800 to 5,000 angstroms. The thickness of the n-type and p-type layers may be in the range of 25 to 400 angstroms.

II. The Multiple Glow Discharge Deposition Chambers

Figure 2:
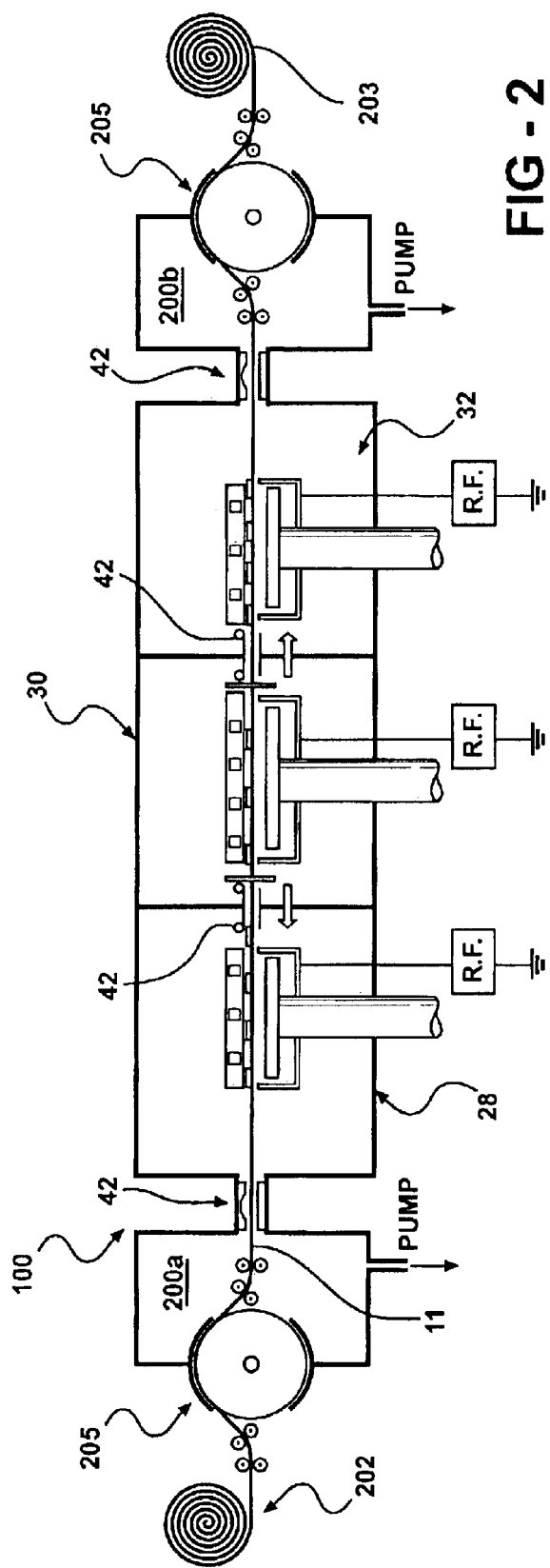
FIG. 2 is a diagrammatic representation of a multiple glow discharge chamber deposition system adapted for the continuous production of the photovoltaic devices shown in FIG. 1, which system includes a preferred embodiment of the air-to-vacuum gas gates for isolating the pay-off roll and take-up roll.

Turning now to FIG. 2, a diagrammatic representation of a multiple glow discharge chamber deposition apparatus for the continuous production of the tandem photovoltaic cells, previously described, is generally illustrated by the reference numeral 100. The multiple glow discharge chamber deposition apparatus 100 includes transition chambers 200a and 200b, interconnected to the atmosphere by air-to-vacuum gas gates in accordance with the principles of the present invention. A first transition chamber 200a takes the web from a pay-off roll 202 in the atmospheric region having atmospheric pressure and leads the web to the deposition chambers. A second transition chamber 200b takes the web from the deposition chambers and leads the web back to atmospheric region and take-up roll 203. The apparatus 100 includes a plurality of dedicated deposition chambers, adjacent chambers of which being operatively interconnected. The term "isolated" as used herein will mean that the reaction gas mixture introduced into one of the adjacent deposition chambers is substantially prevented from cross-contaminating the mixtures introduced into the adjacent chamber. Note that the word "substantially" was used to modify "prevented"; this is because no isolation mechanism is 100% effective.

The apparatus 100 is adapted to deposit a high volume of large area, amorphous photovoltaic cells having a p-i-n configuration onto the surface of a substrate 11, which is continually fed therethrough. To deposit the layers of amorphous semiconductor material required for producing a tandem cell of the p-i-n configuration, the apparatus 100 includes at least one triad of deposition chambers, each triad comprising: a first deposition chamber 28 in which a p-type conductivity layer of amorphous silicon alloy material is deposited onto the surface of the substrate 11 as the substrate 11 passes therethrough; a second deposition chamber 30 in which an intrinsic layer of amorphous silicon alloy material is deposited atop the p-type layer on the surface of the substrate 11 as the substrate 11 passes therethrough; and a third deposition chamber 32 in which an n-type conductivity layer of silicon alloy material is deposited atop the intrinsic layer on the surface of the substrate 11 as the substrate 11 passes therethrough.

It should be apparent that: (1) although one triad of deposition chambers has been described, additional triads or additional individual chambers may be added to the apparatus to provide the apparatus with the capability of producing photovoltaic cells having any number of layers; (2) the air-to-vacuum gas gate of the present invention is applicable in any environment in which a substrate must be taken from atmospheric pressure to a vacuumized region or taken from a vacuumized region to atmospheric pressure; (3) although the substrate material is shown and described as a continuous web of material, the concept of the present invention may be adapted for depositing successive layers atop discrete substrate plates which can be continuously fed through the plurality of deposition chambers; (4) although not shown, other chambers (such as a chamber for adding a TCO layerer atop the uppermost dopant layer of the photovoltaic device) may be operatively connected to the glow discharge apparatus 100; and (5) the substrate pay-off roll 202 and the substrate take-up roll 203 are not shown in separate chambers. However, the respective rolls may be in any area of atmospheric pressure, such as a vacuumized chamber, or any area with a pressure higher than that of the transition chamber.

To form the photovoltaic cell 10 illustrated in FIG. 1, an p-type layer of amorphous silicon alloy material is deposited onto the substrate 11 in the deposition chamber 28, an intrinsic layer of amorphous silicon alloy material is deposited atop the n-type layer in the deposition chamber 30 and a n-type layer of amorphous silicon alloy material is deposited atop the intrinsic layer in the deposition chamber 32. The apparatus 100 successively deposits at least three layers of amorphous silicon alloy material onto the substrate 11 wherein the intrinsic layer deposited in deposition chamber 30 differs in composition from the layers deposited in deposition chamber 28 and 32 by the absence of at least one element which will be referred to as the dopant or doping species.

It is important that each of the layers (and particularly the intrinsic layer) deposited onto a surface of the substrate 11 be of high purity in order to produce high efficiency photovoltaic devices 10. It is therefore necessary to substantially prevent the contamination and/or damage of the substrate, as well as, cross-contamination of process gases into other deposition chambers. In order to prevent back diffusion of process gases to the intrinsic deposition chamber 30 from the dopant deposition chambers 28 and 32 through the prior art gas gates 42, the p-dopant deposition chamber 28 and the n-dopant deposition chamber 32 are maintained at a lower internal pressure than the intrinsic deposition chamber 30, as described in U.S. Pat. No. 5,374,313, which is hereby incorporated herein by reference. To that end, each deposition chamber may be provided with automatic throttle valves, pumps, and manometers (not illustrated). Each throttle valve is operatively connected to a respective pump so as to evacuate excess and spent deposition constituents from the deposition chambers. Each absolute manometer is operatively connected to a respective deposition chamber and a respective one of the throttle valves for controlling the pressure within said deposition chambers. Hence, a constant pressure differential is established and maintained between adjacent chambers.

Figure 3:
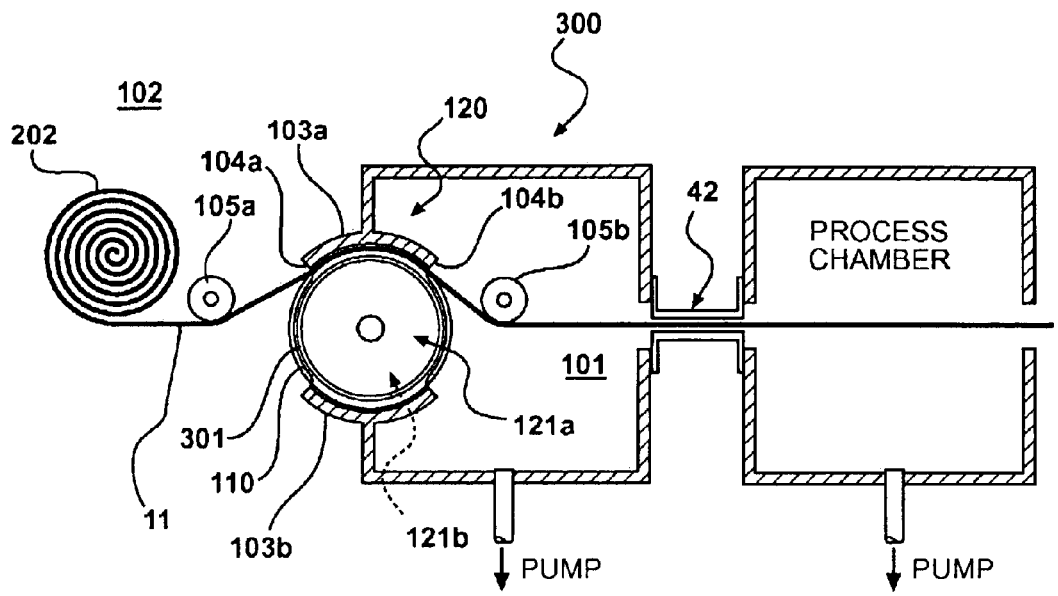
FIG. 3 is a side view of a preferred embodiment of the gas gate of the present invention which details the tension created by two rollers and the main cylinder as the web of substrate material advances from atmospheric pressure to vacuum pressure.
Figure 4:
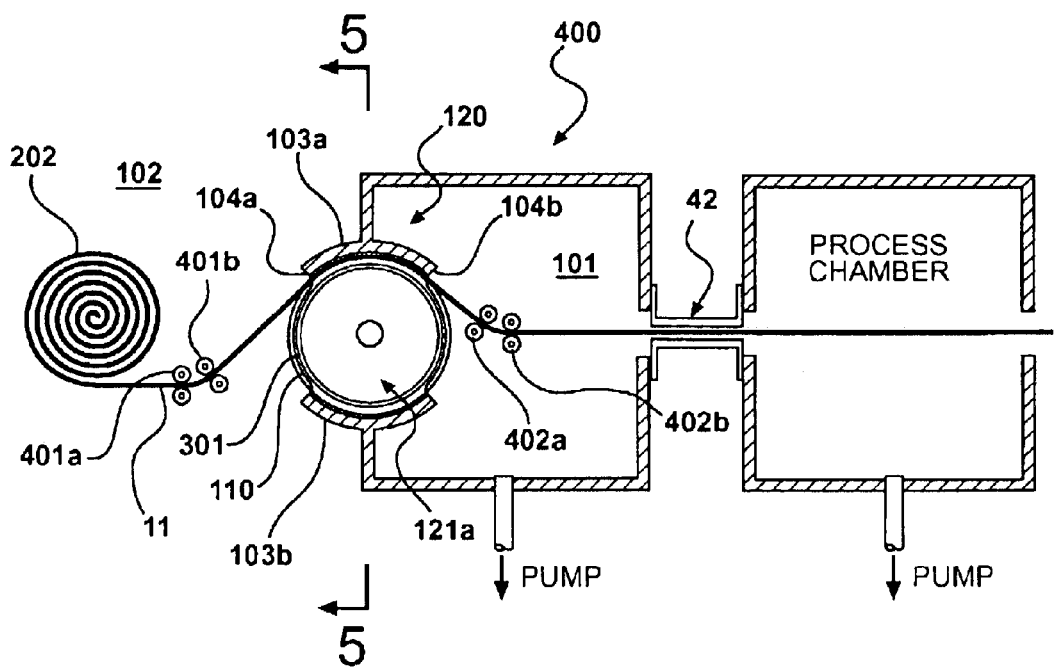
FIG. 4 is a side view of an embodiment of the gas gate of the present invention which details the tension created by a four sets of rollers, two sets in the atmospheric region and two sets in the vacuum region, and the main cylinder as the web of substrate material advances from atmospheric pressure to vacuum pressure.

Turning now to FIGS. 3 and 4, embodiments of the isolation passageway of the instant invention are illustrated generally by the reference numerals 300 and 400, respectively. It is to be noted that the isolation passageway is formed with an inner, generally elongated, cylinder 110. The circumferential surface of the cylinder 110 may be manufactured from a large variety of materials, that include but is not limited to metals such as aluminum, alloys such as stainless steel and KOVAR®, or composites such as plated steel or carbon/epoxy. Preferably, the cylinder is manufactured from metal for ease of machined fabrication and the metal of choice for the cylinder is also used to manufacture the housing 120, including the top plate 103a, bottom plate 103b, first side wall 121a and second side wall 121b, so the thermal expansions match. Preferably, the circumferential surface of the cylinder is smooth to minimize the introduction of differing pressures of air that may enter adjoining chambers after being trapped in spaces created between the web and the circumferential surface of the cylinder. The gas gate of the present invention may be used with any web material, such as thermoplastic polymer, such as polycarbonate, poly methyl methacrylate, polyolefin, polyester, poly vinyl chloride, polysulfone, cellulosic substances, etc. The web thickness is preferably about 0.05 mm to about 5 mm, depending upon the intended application. However, the substrate material may be formed from a magnetic material and the substrate may be urged into contact with the circumferential surface by magnetic attraction.

The length of the cylinder 110 is dependent upon the width of the web of substrate material 11, which is adapted to pass therethrough between the transition chamber 101 and the atmospheric region 102. The length of the cylinder 110 must be at least equal to the width of the web 11. The isolation passageway further includes a housing, generally referred to by reference numeral 120, having a first sidewall 121a, a second sidewall 121b, a top plate 103a and a bottom plate 103b. The cylinder 110 is fastened between the sidewalls 121a and 121b to allow the cylinder to rotate about an axis between the sidewalls 121a and 121b. More particularly, the web of substrate material 11 enters the isolation passageway through the introductory slot 104a and exits the passageway through exit slot 104b. The top plate 103a may be generally arced in configuration to conform to the arc of the top peripheral portion of the cylinder 110 and is secured to a wall of the transition chamber 101. Similarly, the bottom plate 103b may be generally arced in configuration to conform to the arc of the bottom peripheral portion of the cylinder 110 and is secured to a wall of the transition chamber 101. The top plate 103a is preferably shaped in a generally arced configuration so as to be at all points equidistant from the contiguous surface of the web of substrate material 11 which has assumed the contour of the top peripheral portion of the cylinder 110 against which it is tightly pressed. FIG. 4 shows a preferred embodiment of the isolation passageway of the present invention in which the web of substrate 11 is advancing from an atmospheric region 102 into an evacuable transition vacuum chamber 101 through a top peripheral gap. Although air is able to enter transition chamber 101 through the gap between the top plate and the substrate 11, the amount of air is kept manageable by keeping the gap sufficiently narrow. Preferably, the width of the gap is approximately the width of the web of substrate material 11, which is adapted to pass therethrough.

Deposition cathodes may be either under the web or over the web. In another embodiment, the web may be adapted to flow between the bottom peripheral portion of the cylinder and the bottom plate, which forms a bottom peripheral gap. The bottom peripheral gap is sufficiently wide to allow the web of substrate to maintain contact with the cylinder without coming in contact with the housing. Rollers are positioned to allow the web to material between the bottom peripheral portion of the cylinder 110 and the bottom plate 103b. In this embodiment, the bottom plate 103b is preferably shaped in a generally arced configuration so as to be at all points equidistant from the contiguous surface of the web of substrate material which has assumed the contour of the bottom peripheral portion cylinder 110 against which it is tightly pressed. Although air is able to enter transition chamber 101 through the gap between the bottom plate and the substrate 11, the amount of air is kept manageable by keeping the gap sufficiently narrow.

Figure 5:
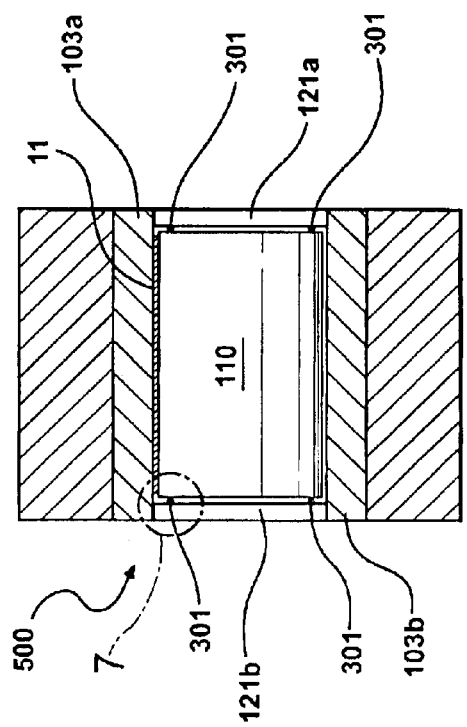
FIG. 5 is a partial cross-sectional view taken along line 5—5 of FIG. 4 and illustrating the operative disposition of a vacuum-tight end seal for preventing leakage between the interior of the gas gate of the subject invention and the atmospheric region.
Figure 7:
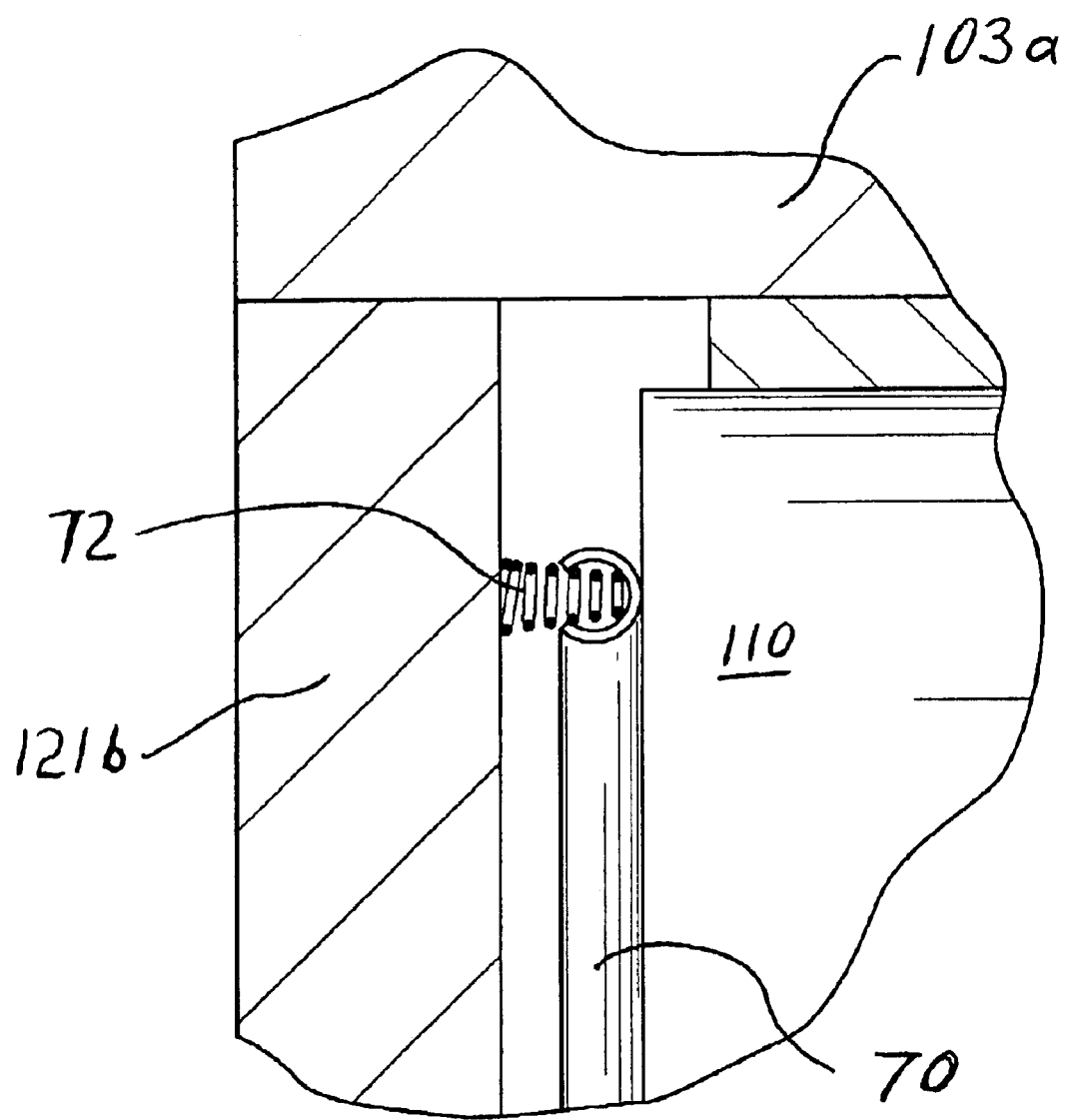
FIG. 7 is a magnified illustration of 7 from FIG. 5 which illustrates a U-shaped O-ring receiving pressure from a spring.

Due to the rotation of the cylinder within the housing, the possibility exists for air leaks between the cylinder and the sidewalls. In a preferred embodiment, to reduce the possibility of air leaks, an O-ring 301 may be set between each side of the cylinder 110 and each sidewall 121a and 121b to minimize the influx of air into the vacuumized transition chamber 101, as illustrated in FIG. 5. The O-ring 301 should be set to maintain contact with the inner sides of the sidewalls 121a and 121b, and with the cylinder 110. Preferably, the O-ring 301 is fabricated from a low friction, low wear material such as polytetrafluorethylene, which is sold as TEFLON®, because it contacts at least one moving surface. The O-ring 301 may be any circularly shaped device capable of providing a seal between the sidewalls 121a and 121b and the cylinder 110. In a preferred embodiment, a U-shaped or C-shaped O-ring 301 is set between each side of the cylinder 110 and the respective sidewall 121a and 121b with the smooth/closed end of the U-shape or C-shape in contact with the inner side of the respective sidewall 121a and 121b. A partial cross section of a C-shaped O-ring seal 70 is illustrated in FIG. 7. A U-shaped O-ring may also be used. The seal opening, i.e. the open end of the U-shape or C-shape, should face system pressure to fully maximize the self energizing effect when axial pressure is supplied from the respective side wall 121a and 121b to the cylinder 110. System pressure may be supplied by at least one spring 72. For example, at least one spring 72, preferably a helicoidal spring, may be set in the open end of the U-shape and a circular groove in the cylinder 110 to provide pressure from the side wall 121b into the O-ring 70 toward the cylinder 110, as illustrated in FIG. 7. Preferably, several springs are incorporated to maximize the number of secure contact points. The sidewalls 121a (not shown) and 121b should be designed to completely cover the circular grooves and O-rings on both sides of the cylinder 110, to minimize the potential air leaks. The system pressure presses the O-ring 70 against the cylinder from the respective sidewall 121a (not shown) and 121b. This may be accomplished by incorporating several springs around the circumference of the cylinder 110.

In a preferred embodiment, two sets of rollers 401a and 401b guide the web into the introductory slot 104a and two sets of rollers 402a and 402b guide the web 11 out of the exit slot 104b, as illustrated in FIG. 4. The sets of rollers 401a, 401b, 402a and 402b are adapted to allow the web of substrate 11 to pass between each set to minimize the contact area between the rollers and the web. A first set of rollers 401a in the first region, which may be an atmospheric region, maintain the web 11 tension in the area between the pay-off roll 202 and the first set of rollers 401a. A second set of rollers 401b in the first region maintain the web 11 tension in the area between the second set of rollers 401b and the introductory slot 104a. The web 11 tension between the first set of rollers 401a and the second set of rollers 401b is reduced to create an angle for smoothly entering the introductory slot 104a, as illustrated in FIG. 4. A third set of rollers 402a in the second region 101, which may be an evacuated transition chamber, maintain the web 11 tension in the area between the exit slot 104b and the third set of rollers 402a. A fourth set of rollers 402b in the second region 101 maintain the web 11 tension in the area between the fourth set of rollers 402b and the entrance to the deposition chamber. The web 11 tension between the third set of rollers 402a and the fourth set of rollers 402b is reduced to create an angle for smoothly exiting the exit slot 104b, as illustrated in FIG. 4. To prevent contamination of or damage to the web of substrate material 11, the angles should be set so that, the web 11 does not contact the top plate 103a and the gap between the top plate 103a and the top peripheral portion of the cylinder 110 is minimized. The size of the gap depends on the thickness of the substrate and the thickness of the layers to be deposited on the substrate. It should be apparent from the description that the gas gate of the present invention may operate in a similar fashion between the transition chamber and the take up roll.

The rollers 401a, 401b, 402a and 402b are shaped to avoid contact with the deposition area. The edges of the rollers 401a, 401b, 402a and 402b are slightly raised to allow the web 11 to flow smoothly through the system while avoiding contact with the deposition area of the web 11. The inner areas of the rollers 401a, 401b, 402a and 402b do not contact the web 11 as the rollers grip the edges of the web 11 to avoid contact with the deposition surface. Preferably, one side of the web of substrate is not touched by any solid object such as a roller, cylinder or housing, as it enters or exits the deposition areas. This is of particular importance for the production of OLED, where the web that enters the machine may already have organic pre-coats on that cannot be touched.

Preferably, the top plate 103a is shaped in a generally circular configuration so as to be at all points equidistant from the contiguous surface of the web of substrate material 11 which has assumed the contour of the cylinder 110 against which it is tightly pressed. Similarly, the bottom plate 103b is preferably shaped in a generally circular configuration so as to be at all points equidistant from the bottom peripheral surface of the cylinder 110. The gap created by the distance between the bottom plate 103b and the bottom peripheral surface of the cylinder 110 is preferably the same or less than the gap between the top plate 103a and the top peripheral surface of the cylinder 110. This is somewhat dependant on the thickness of the web of substrate material 11, which moves over the top peripheral surface of the cylinder 110.

FIG. 3 shows another embodiment of the present invention in which the web 10 is kept in close contact to the cylinder 110 with the aid of tension rollers positioned at both the near end 105a and the far end 105b of the cylinder 110. A first roller 105a at the near end of the cylinder is located in the atmospheric region. A second roller 105b at the far end of the cylinder is located in the transition chamber vacuum. The web of substrate material 11 is held tightly against the top peripheral surface of the cylinder 110 by tension developed by the turning rollers 105a and 105b. The rollers 105a and 105b are positioned so that the bottom peripheral surface of each roller 105a and 105b is below the top peripheral surface of the cylinder 110, which creates tension as the web 11 advances below the first roller 105a, over the cylinder 110 and below the second roller 105b. The tension holds the web 11 tightly against the bottom peripheral surface of each roller 105a and 105b and the top peripheral surface of the cylinder 110. The web 11 is fed into the transition vacuum chamber 101 with the near end side roller 105b positioned to allow the web 11 to smoothly enter the cylinder 110 between the top peripheral portion of the cylinder and the top plate 103a of the housing 120. A small gap is created between top peripheral portion of the cylinder 110 and the top plate 103a of the housing 120. The web 11 enters the introductory slot 104a past the near end roller 105a and is guided into the top gap.

It should be appreciated from the drawings and description that the position of the web and rollers may be inverted to produce a gas gate in which the web flows from one region to another through a bottom peripheral gap between the bottom peripheral portion of the cylinder and the bottom plate. However, the physics remain the same for the top gap embodiments and the bottom gap embodiments.

In an embodiment wherein the web flows through the bottom peripheral gap, a first of two rollers may be adapted to guide the web into an introductory slot from a first region, which may be an atmospheric region, through the bottom peripheral gap and two sets of rollers guide the web out of an exit slot from the bottom peripheral gap to a second region, which may be an evacuated transition chamber. The sets of rollers are adapted to allow the web of substrate to pass between each set to minimize the contact area between the rollers and the web. A first set of rollers in the first region maintain the web tension in the area between the pay-off roll and the first set of rollers. A second set of rollers in the first region maintain the web tension in the area between the second set of rollers and the introductory slot of the bottom peripheral gap. The web tension between the first set of rollers and the second set of rollers is reduced to create an angle for smoothly entering the introductory slot of the bottom peripheral gap. A third set of rollers in the second region maintain the web tension in the area between the exit slot of the bottom peripheral gap and the third set of rollers. A fourth set of rollers in the second region the web tension in the area between the forth set of rollers and the entrance to the deposition chamber. The web tension between the third set of rollers and the fourth set of rollers is reduced to create an angle for smoothly exiting the exit slot. To prevent contamination of or damage to the web of substrate material, the angles should be set so that, the web does not contact the bottom plate and the gap between the bottom plate and the bottom peripheral portion of the cylinder is minimized. The size of the gap depends on the thickness of the substrate and the thickness of the layers to be deposited on the substrate. It should be apparent from the description that the gas gate of the present invention may operate in a similar fashion between the transition chamber and the take up roll.

In another embodiment of the present invention wherein the web flows through a bottom gap between the bottom peripheral portion of the cylinder and bottom plate, the web is kept in close contact to the cylinder with the aid of tension rollers positioned at both the near end and the far end of the cylinder. A first roller at the near end of the cylinder is located in the atmospheric region and a second roller at the far end of the cylinder is located in the transition chamber vacuum. The web of substrate material is held tightly against the bottom peripheral surface of the cylinder by tension developed by the turning rollers. The rollers are positioned so that the top peripheral surface of each roller is above the bottom peripheral surface of the cylinder, which creates tension as the web advances above the first roller, under the cylinder and above the second roller. The tension holds the web tightly against the top peripheral surface of each roller and the bottom peripheral surface of the cylinder. The web may be fed into the transition vacuum chamber with the near end side roller positioned to allow the web to smoothly enter the cylinder between the bottom peripheral portion of the cylinder and the bottom plate of the housing. A small gap is created between bottom peripheral portion of the cylinder and the bottom plate of the housing. The web enters the introductory slot of the bottom gap past the near end roller and is guided into the bottom gap.

Turning now to FIG. 5, a cross sectional view of the inner cylindrical drum 110 of the isolation passageway 100 of the instant invention is employed so as to best illustrate the circumferential surface thereof. More particularly, the cylinder 110 includes a circumferential surface against a portion of which the web of substrate material 11 is continuously urged into contact. The length of the circumferential surface should be at least as wide as the width of the web of substrate material 11 passing thereagainst so that the entire width of the web 11 contacts the circumferential surface. Although not shown, a drive system may be employed to provide for the rotation of the cylinder 110 so that rotation of the drum 110 can be used to provide tension on the web of substrate material 11 intermediate of the web drive assemblies. Because of the tight tension which may now be placed on the web of substrate material 11, warpage and canoeing of the web 11 is almost totally eliminated thereby enabling the total height of the passageway opening to be reduced thereby decreasing the possibility of vacuum pressure in the transition chamber 101 to rise to an unacceptable level.

It is further to be noticed, and as best illustrated in FIG. 3, that the web of substrate material 11 may be brought into the introductory slot or may exit from the exit slot at an angle with respect to the turning rollers 105a and 105b because of the tangential manner in which the web of substrate material 11 is wrapped about a portion of the circumference of both the turning rollers 105a and 105b and the circularly shaped cylinder 110. To prevent contamination of or damage to the web of substrate material 11, the angle should be set so that, the web does not contact the top plate 103a and the gap between the top plate 103a and the top peripheral portion of the cylinder 110 is minimized.

On the bottom face of the transition chamber, a valve and a means for evacuating the chamber are connected to make it possible to reduce the pressure within the transition chamber, as illustrated in FIGS. 3 and 4. The means for evacuating the chamber may be a vacuum pump such as a diffusion pump or any other device capable of lowering the pressure of an evacuable chamber. As the air flows through the gap, its pressure decreases and as a result, the velocity of the air increases. When the velocity becomes transsonic, the gas conductance of the gap between the top plate 103a and the top peripheral portion of the cylinder 110 becomes "choked," and any decrease in the pressure of the chamber vacuum results in no further increase in the air flow, as described in U.S. Pat. No. 5,374,313 issued to Doehler et al. on Dec. 20, 1994, which is hereby incorporated herein by reference. Given a pair of gaps, one at the top peripheral surface of the cylinder and a second at the bottom peripheral surface of the cylinder, 12 inches wide (the width of a typical web), 0.001 inches high, and 10 inches long about ¼ of the circumference of a 1 foot diameter cylinder), the conductance becomes choked at pressures below approximately 0.4 Torr. At 0.4 Torr and below, the gas load due to air leak on the transition chamber's pump is about 200 sccm. That gas load is reasonable given the parameters and is offset by at least one means for evacuating said transition chamber, such as a diffusion pump. In other words, the novel invention described herein may take the web from atmospheric pressure to the millitorr pressure regime, i.e. about 0.001 Torr to about 0.01 Torr, in a single step.

The gas load is very dependent upon the gap that is capable of being maintained between the circumferential surface of the cylinder and the housing. In another embodiment, the gaps are 0.002 inches in thickness. This increases the gas load to approximately 1600 sccm. In this embodiment, two means for evacuating the transition chamber may be incorporated to achieve and maintain the millitorr regime. Additionally, more diffusion pumps may be incorporated to meet the needs of a given system with a given gap. It should be apparent that the examples given are not limiting. The range of web width, the range of gap width, the range of cylinder diameter and the range of pressures in the transition chamber may be set to any level provided that the basic physics of the system allow the transition chamber to maintain a constant pressure below the atmospheric region, preferably at about 0.01 Torr and below, most preferably in the millitorr region, which is about 0.001 Torr to about 0.01 Torr.

As described above, the air leaks along the side of the cylinder may need to be controlled to achieve and maintain the millitorr regime. An O-ring may be set inside the outer ring of each side of the cylinder to limit the width of the air gap located in that section. This allows the cylinder to have the bearings and mechanical drive system in air. It is essential that a leak-tight seal be provided between the environment and the edge portions of the cylinder of the gas gate. End seals may be incorporated for use with the gas gate of the present invention, as described in U.S. Pat. No. 4,723,507 issued to Ovshinsky et al. on Feb. 9, 1988, which is hereby incorporated herein by reference. Each of the end seals is generally annularly shaped with a substantially E-shaped cross sectional configuration. The radially outermost bite portion of the E-shaped outer end seal is adapted to receive thereinto the encapsulating wall, while the radially innermost bite portion of the E-shaped seal is adapted to receive thereinto a peripheral edge of the elongated cylinder. Both the radially innermost wall of the innermost bite shaped portion and the radially outermost portion of the outermost bite may be indented to receive spaced O-rings. Pumps may be operatively disposed and adapted to evacuate any diffusing gases from the space between each of the pair of O-rings in both the upper and lower bite portions of the E-shaped seals so as to prevent the introduction of contaminants from the atmosphere into the vacuumized transition chamber.

In another embodiment, the gas gate of the instant invention employs magnetic rollers to accurately and safely guide a magnetically attractable substrate through a passageway. The magnetic rollers reduce frictional abrasion of the substrate.

Figure 6:
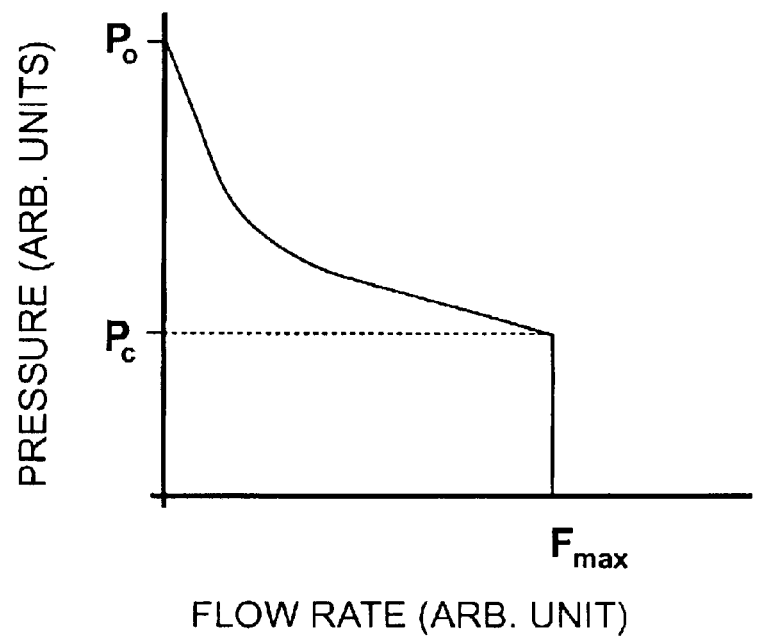
FIG. 6 is a graphical representation of the relationship between the pressure in the transition chamber, plotted on the ordinate, and the flow of air in the transonic flow channel, plotted on the abscissa.

Next a brief description of the physics/mechanics of the gas gate of the instant invention is in order. FIG. 6 is a graphical representation of the relationship between the pressure in the transition chamber, plotted on the ordinate, and the flow rate of air/gas in the gaps, plotted on the abscissa. As can be seen from a perusal of this figure, when the pressure in the transition chamber is equal to the pressure in the atmospheric region ($P_o$), there is no flow of air/gas in the gaps. As the pressure in the transition chamber drops, the flow of air/gas increases, until a point at which the gas in the gaps is transonic. This critical pressure is denoted as $P_c$ and the flow rate at this pressure is denoted as $F_{max}$. Any further reduction in the pressure of the transition chamber beyond the critical pressure will not increase the flow rate of the air/gas through the gaps.

At pressures lower than this critical pressure, the system air/gas flows are locked and will not increase, regardless of how low the pressure in the transition chamber is reduced. This can be shown by a consideration of the relative velocities of the air/gas in the gaps and pressure disturbances in the transition chamber. Pressure disturbances within air/gas (sounds, pressure drops etc.) travel in the air/gas at the "speed of sound" in that air/gas. Therefore, any pressure change in the transition chamber is transmitted through the gaps at the speed of sound. However, at transition chamber pressures below $P_c$, the flow rate of air/gas in gaps is transonic. Therefore the pressure disturbance will never propagate upstream within the gaps. Therefore, any further reduction of pressure (i.e. pressure disturbance) within the transition chamber will not be communicated upstream and therefore the air/gas flow rate in the gaps is locked at $F_{max}$. Also it can be seen that once the system flow rates are locked, the pressures in the gaps are always greater than or equal to $P_c$. This locked flow mode is also called a choked mode.

It should be understood that the present invention is not limited to the precise structure of the illustrated embodiments. It is intended that the foregoing description of the presently preferred embodiments be regarded as an illustration rather than as a limitation of the present invention. It is the claims, which follow, including all equivalents, which are intended to define the scope of this invention.

We claim:

1. An apparatus for the interconnecting a first region having a gaseous pressure and a second region having a gaseous pressure, wherein the gaseous pressure of said first region is different from the gaseous pressure of said second region, said apparatus comprising:

a gas gate interconnecting said first region and said second region, said gas gate comprising, a cylinder, having a top peripheral portion and a bottom peripheral portion, set in a housing through which a web of substrate material is adapted to move between said first region and said second region, said web maintaining contact with the top peripheral portion of said cylinder to create a top gap between said web and said housing, said gas gate providing for choke mode transonic flow of air leaks between said first region and said second region;

at least one roller positioned in said first region, said at least one first region roller adapted to guide said web into said top gap;

at least one roller positioned in said second region, said at least one second region roller adapted to guide said web out of said top gap; and at least one means for evacuating at least one of said first region and said second region.

2. The apparatus of claim 1, said housing having a top plate and a bottom plate, wherein said cylinder is set between said top plate and said bottom plate.

3. The apparatus of claim 2, said top plate having a contour, wherein said top plate contour is fashioned to approximately equal the arc of the top peripheral portion of said cylinder.

4. The apparatus of claim 2, said bottom plate having a contour, wherein said bottom plate contour is fashioned to approximately equal the arc of the bottom peripheral portion of said cylinder.

5. The apparatus of claim 2, said housing having a first side wall between said top plate and said bottom plate and second side wall between said top plate and said bottom plate, wherein said cylinder is set between said first side wall and said second side wall to rotate about an axis between said first side wall and said second side wall.

6. The apparatus of claim 1, wherein the circumferential surface of said cylinder, which contacts the web the substrate material is fabricated from a low friction, low thermal conductivity material.

7. The apparatus of claim 1, wherein the circumferential surface of said cylinder is formed from a material selected from the group consisting of aluminum, stainless steel, plated steel and borosilicate glass.

8. The apparatus of claim 1, wherein the substrate material is selected from the group consisting of polycarbonate, poly methyl methacrylate, polyolefin, polyester, poly vinyl chloride, polysulfone and cellulosic substances.

9. The apparatus of claim 1, wherein one of said first region and said second region is evacuated to a pressure of about 0.001 Torr to about 0.01 Torr.

10. The apparatus of claim 1, wherein said at least one means for evacuating is at least one diffusion pump.

11. The apparatus of claim 3, said top plate being at all points equidistant from said web, wherein said top gap maintains a uniform distance between said web and said top plate.

12. The apparatus of claim 2, said at least one first region roller comprising one first region roller, wherein said one first region guides said web into said gap at an angle sufficient to avoid web contact with said top plate.

13. The apparatus of claim 2, said at least one second region roller comprising one second region roller, wherein said one second region roller guides said web out of said gap at an angle sufficient to avoid web contact with said top plate.

14. The apparatus of claim 2, said at least one first region roller comprising a first set rollers and a second set of rollers, wherein said web is adapted to move between each roller of said first set and each roller of said second set, wherein each roller of said first and second sets maintains contact with said web sufficient to move said web into said gap, wherein a reduction in web tension between said first set and said second set produces an angle in said web sufficient to avoid web contact with said top plate.

15. The apparatus of claim 14, said at least one second region roller comprising a third set rollers and a forth set of rollers,
wherein said web is adapted to move between each roller of said third set and each roller of said forth set,
wherein each roller of said third and forth sets maintains contact with said web sufficient to move said web out of said gap,
wherein a reduction in web tension between said third set and said forth set produces an angle in said web sufficient to avoid web contact with said top plate.

16. An apparatus for continuously moving of a web of substrate material into a vacuum chamber from an atmospheric region, said apparatus comprising:
an evacuable vacuum chamber;
means for evacuating said vacuum chamber to sub-atmospheric pressure;
a gas gate interconnecting said atmospheric region and said vacuum chamber, said gas gate comprising, a cylinder having a top peripheral portion set in a housing through which a web of substrate material is adapted to move between said atmospheric region and said vacuum chamber, said web maintaining contact with the top peripheral portion of said cylinder to create a gap between said web and said housing, said gas sate providing for choke mode transonic flow of air leaks between said atmospheric region and said vacuum chamber;
a first roller positioned in said atmospheric region, said first roller is adapted to guide said web into said gap; and
a second roller positioned inside said vacuum chamber, said second roller adapted to guide said web out of said gap.

17. The apparatus of claim 16, said housing having a top plate and a bottom plate, wherein said cylinder is set between said top plate and said bottom plate.

18. The apparatus of claim 17, said top plate having a contour, wherein said top plate contour is fashioned to approximately equal the arc of the top peripheral portion of said cylinder.

19. The apparatus of claim 17, said bottom plate having a contour, wherein said bottom plate contour is fashioned to approximately equal the arc of the bottom peripheral portion of said cylinder.

20. The apparatus of claim 17, said housing having a first side wall between said top plate and said bottom plate and second side wall between said top plate and said bottom plate, wherein said cylinder is set between said first side wall and said second side wall to rotate about an axis between said first side wall and said second side wall.

21. The apparatus of claim 16, wherein the circumferential surface of said cylinder, which contacts the web the substrate material is fabricated from a low friction, low thermal conductivity material.

22. The apparatus of claim 16, wherein the circumferential surface of said cylinder is formed from a material selected from the group consisting of aluminum, stainless steel, plated steel and borosilicate glass.

23. The apparatus of claim 22, wherein the substrate material is selected from he group consisting of polycarbonate, poly methyl methacrylate, polyolefin, polyester, poly vinyl chloride, polysulfone and cellulosic substances.

24. The apparatus of claim 16, wherein said means for evacuating evacuates said vacuum chamber to a pressure of about 0.001 Torr to about 0.01 Torr.

25. The apparatus of claim 16, wherein said means for evacuating evacuates said vacuum chamber is a diffusion pump.

26. The apparatus of claim 18, said top plate being at all points equidistant from said web, wherein said gap maintains a uniform distance between said web and said top plate.

27. The apparatus of claim 16, wherein said first roller guides said web into said gap at an angle sufficient to avoid web contact with said top plate.

28. The apparatus of claim 16, wherein said second roller guides said web out of said gap at an angle sufficient to avoid web contact with said top plate.

29. An apparatus for continuously moving of a web of substrate material into a vacuum chamber from an atmospheric region, said apparatus comprising:
an evacuable vacuum chamber;
means for evacuating said vacuum chamber to sub-atmospheric pressure; a gas gate interconnecting said atmospheric region and said vacuum chamber, said gas gate comprising, a cylinder having a top peripheral portion set in a housing through which a web of substrate material is adapted to move between said atmospheric region and said vacuum chamber, said web maintaining contact with the top peripheral portion of said cylinder to create a gap between said web and said housing, said gas gate providing for choke mode transonic flow of air leaks between said atmospheric region and said vacuum chamber;
a first set rollers and a second set of rollers,
wherein said web is adapted to move between each roller of said first set and each roller of said second set,
wherein each roller of said first and second sets maintains contact with said web sufficient to move said web into said gap,
wherein a reduction in web tension between said first set and said second set produces an introductory angle in said web sufficient to avoid web contact with said housing; and
a third set rollers and a forth set of rollers,
wherein said web is adapted to move between each roller of said third set and each roller of said forth set,
wherein each roller of said third and forth sets maintains contact with said web sufficient to move said web out of said gap,
wherein a reduction in web tension between said third set and said forth set produces an exit angle in said web sufficient to avoid web contact with said housing.

30. The apparatus of claim 29, said housing having a top plate and a bottom plate, wherein said cylinder is set between said top plate and said bottom plate.

31. The apparatus of claim 30, said top plate having a contour, wherein said top plate contour is fashioned to approximately equal the arc of the top peripheral portion of said cylinder.

32. The apparatus of claim 30, said bottom plate having a contour, wherein said bottom plate contour is fashioned to approximately equal the arc of the bottom peripheral portion of said cylinder.

33. The apparatus of claim 30, said housing having a first side wall between said top plate and said bottom plate and second side wall between said top plate and said bottom plate, wherein said cylinder is set between said first side wall and said second wall to rotate about an axis between said first side wall and said second side wall.

34. The apparatus of claim 29, wherein the circumferential surface of said cylinder, which contacts the web the substrate material is fabricated from a low friction, low thermal conductivity material.

35. The apparatus of claim 29, wherein the circumferential surface of said cylinder is formed from a material selected from the group consisting of aluminum, stainless steel, plated steel and borosilicate glass.

36. The apparatus of claim 29, wherein the substrate material is selected from the group consisting of polycarbonate, poly methyl methacrylate, polyolefin, polyester, poly vinyl chloride, polysulfone and cellulosic substances.

37. The apparatus of claim 29, wherein said means for evacuating evacuates said vacuum chamber to a pressure of about 0.001 Torr to about 0.01 Torr.

38. The apparatus of claim 29, wherein said means for evacuating evacuates said vacuum chamber is a diffusion pump.

39. The apparatus of claim 30, said top plate being at all points equidistant from said web, wherein said gap maintains a uniform distance between said web and said top plate.

40. The apparatus of claim 1, wherein the ends of said cylinder are leak-proofed by an annularly-shaped end seal.

41. The apparatus of claim 40, wherein each of the end seals include a pair of spaced O-rings.

42. The apparatus of claim 41, wherein a pump is provided to evacuate the space between each of the O-rings.

43. An apparatus for the interconnecting an first region having a gaseous pressure and a second region having a gaseous pressure, wherein the gaseous pressure of said first region is different from the gaseous pressure of said second region, said apparatus comprising:
   a gas gate interconnecting said first region and said second region, said gas gate comprising, a cylinder, having a top peripheral portion and a bottom peripheral portion, set in a housing through which a web of substrate material is adapted to move between said first region and said second region, said web maintaining contact with the bottom peripheral portion of said cylinder to create a bottom gap between said web and said housing, said housing having a top plate and a bottom plate, wherein said cylinder is set between said top plate and said bottom plate, said housing having a first side wall between said top plate and said bottom plate and second side wall between said top plate and said bottom plate, wherein said cylinder is set between said first side wall and said second side wall to rotate about an axis between said first side wall and said second side wall;
   a first O-ring set between the first side wall and the cylinder, said first O-ring adapted to reduce an influx of air from a space between the first side wall and the cylinder and further comprising a second O-ring set between the second side wall and the cylinder, said second O-ring adapted to reduce an influx of air from a space between the second side wall and the cylinder;
   at least one roller positioned in said first, said at least one first region roller adapted to guide said web into said bottom gap;
   at least one roller positioned in said second region, said at least one second region roller adapted to guide said web out of said bottom gap; and
   at least one means for evacuating at least one of said first region and said second region.

44. The apparatus of claim 43, said top plate having a contour, wherein said top plate contour is fashioned to approximately equal the arc of the top peripheral portion of said cylinder.

45. The apparatus of claim 43, said bottom plate having a contour, wherein said bottom plate contour is fashioned to approximately equal the arc of the bottom peripheral portion of said cylinder.

46. The apparatus of claim 43, wherein the circumferential surface of said cylinder, which contacts the web the substrate material is fabricated from a low friction, low thermal conductivity material.

47. The apparatus of claim 43, wherein the circumferential surface of said cylinder is formed from a material selected from the group consisting of aluminum, stainless steel, plated steel and borosilicate glass.

48. The apparatus of claim 43, wherein the substrate material is selected from the group consisting of polycarbonate, poly methyl methacrylate, polyolefin, polyester, poly vinyl chloride, polysulfone and cellulosic substances.

49. The apparatus of claim 43, wherein said at least one means for evacuating evacuates said transition chamber to a pressure of about 0.001 Torr to about 0.01 Torr.

50. The apparatus of claim 43, wherein said at least one means for evacuating said transition chamber is a diffusion pump.

51. The apparatus of claim 44, said bottom plate being at all points equidistant from said web, wherein said top gap maintains a uniform distance between said web and said top plate.

52. The apparatus of claim 43, said at least one first region roller comprising one first region roller, wherein said one first region roller guides said web into said gap at an angle sufficient to avoid web contact with said bottom plate.

53. The apparatus of claim 43, said at least one second region roller comprising one second region roller, wherein said one second region roller guides said web out of said gap at an angle sufficient to avoid web contact with said bottom plate.

54. The apparatus of claim 43, said at least one first region roller comprising a first set rollers and a second set of rollers,
   wherein said web is adapted to move between each roller of said first set and each roller of said second set,
   wherein each roller of said first and second sets maintains contact with said web sufficient to move said web into said bottom gap,
   wherein a reduction in web tension between said first set and said second set produces an angle in said web sufficient to avoid web contact with said bottom plate.

55. The apparatus of claim 43, said at least one second region roller comprising a third set rollers and a forth set of rollers,
   wherein said web is adapted to move between each roller of said third set and each roller of said forth set,
   wherein each roller of said third and forth sets maintains contact with said web sufficient to move said web out of said bottom gap,
   wherein a reduction in web tension between said third set and said forth set produces an angle in said web sufficient to avoid web contact with said bottom plate.

56. The apparatus of claim 43, said first O-ring comprising a first C-shaped O-ring adapted to receive a first pressure, said first pressure pressing said first C-shaped O-ring against the cylinder, said second O-ring comprising a second C-shaped O-ring adapted to receive a second pressure, said second pressure pressing said second C-shaped O-ring against the cylinder.

57. The apparatus of claim 56, said first pressure comprising at least one first spring set between the first side wall and the first O-ring, said second pressure comprising at least one second spring set between the second side wall and the second O-ring.

58. The apparatus of claim 5, further comprising a first O-ring set between the first side wall and the cylinder, said first O-ring adapted to reduce an influx of air from a space between the first side wall and the cylinder and further comprising a second O-ring set between the second side wall and the cylinder, said second O-ring adapted to reduce an influx of air from a space between the second side wall and the cylinder.

59. The apparatus of claim 58, said first O-ring comprising a first C-shaped O-ring adapted to receive a first pressure, said first pressure pressing said first C-shaped O-ring against the cylinder, said second O-ring comprising a second C-shaped O-ring adapted to receive a second pressure, said second pressure pressing said second C-shaped O-ring against the cylinder.

60. The apparatus of claim 59, said first pressure comprising at least one first spring set between the first side wall and the first O-ring, said second pressure comprising at least one second spring set between the second side wall and the second O-ring.

* * * * *